United States Patent
Teil et al.

(10) Patent No.: US 10,638,618 B1
(45) Date of Patent: Apr. 28, 2020

(54) COSMETIC INTEGRATION OF DISPLAYS

(71) Applicant: Apple Inc., Cupertino, CA (US)

(72) Inventors: Romain A. Teil, San Francisco, CA (US); Jack J. Wanderman, San Francisco, CA (US); Dominic P. Cincione, Palo Alto, CA (US); Sawyer I. Cohen, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 140 days.

(21) Appl. No.: 15/634,869

(22) Filed: Jun. 27, 2017

Related U.S. Application Data

(60) Provisional application No. 62/361,207, filed on Jul. 12, 2016.

(51) Int. Cl.
| | | |
|---|---|---|
| *H05K 5/00* | (2006.01) | |
| *H03K 17/96* | (2006.01) | |
| *G09G 3/34* | (2006.01) | |
| *G06F 3/044* | (2006.01) | |
| *G06F 3/02* | (2006.01) | |
| *B60K 35/00* | (2006.01) | |

(52) U.S. Cl.
CPC .......... *H05K 5/0017* (2013.01); *B60K 35/00* (2013.01); *G06F 3/0202* (2013.01); *G06F 3/044* (2013.01); *G09G 3/3433* (2013.01); *H03K 17/962* (2013.01); *B60K 2370/143* (2019.05); *B60K 2370/60* (2019.05); *G09G 2380/10* (2013.01)

(58) Field of Classification Search
None
See application file for complete search history.

(56) References Cited

U.S. PATENT DOCUMENTS

| | | | |
|---|---|---|---|
| 4,659,873 A | * | 4/1987 | Gibson .................. H01H 3/141 178/18.05 |
| 5,771,810 A | | 6/1998 | Wolcott |
| 6,446,375 B1 | | 9/2002 | Davis |
| 7,084,859 B1 | | 8/2006 | Pryor |
| 7,612,933 B2 | | 11/2009 | Djordjev |
| 8,000,091 B2 | | 8/2011 | Shinn et al. |
| 8,031,168 B2 | | 10/2011 | Feenstra et al. |
| 8,333,492 B2 | | 12/2012 | Dingman et al. |
| 8,344,870 B2 | | 1/2013 | Evans et al. |

(Continued)

FOREIGN PATENT DOCUMENTS

WO    WO2016/053626    *    4/2016    ............... D03D 1/00

*Primary Examiner* — Christopher R Lamb
(74) *Attorney, Agent, or Firm* — Treyz Law Group, P.C.; G. Victor Treyz; Michael H. Lyons

(57) ABSTRACT

A light-based output device may be used to display images, symbols, and other information for a user of a system such as a vehicle. A display may be formed from a display layer, a covering layer that covers the display layer, and components such as force and touch sensors and electronic shutters. Haptic feedback may be provided using actuators that are coupled to the covering layer. A movable button member may be used to press the covering layer outwardly within an opening, thereby creating a portion of the covering layer that protrudes from other portions of the covering layer. The button member may also be placed in a position in which the covering layer on the button member is flush with other portions of the covering layer. A touch sensor may be incorporated into the covering layer and may overlap a display and areas outside the display.

13 Claims, 20 Drawing Sheets

(56) References Cited

U.S. PATENT DOCUMENTS

| | | |
|---|---|---|
| 8,625,060 B2 | 1/2014 | Wang et al. |
| 8,730,154 B2 | 5/2014 | Dean et al. |
| 8,780,437 B1 | 7/2014 | Lo et al. |
| 8,836,494 B2 | 9/2014 | Reuschel et al. |
| 2004/0017687 A1 | 1/2004 | Misaras |
| 2004/0152502 A1* | 8/2004 | Okada ................. G07F 17/3211 463/16 |
| 2005/0030256 A1* | 2/2005 | Tubidis ................. B60K 35/00 345/30 |
| 2007/0049147 A1 | 3/2007 | Hill et al. |
| 2008/0211652 A1 | 9/2008 | Cope et al. |
| 2010/0149072 A1* | 6/2010 | Waeller ................. B60K 35/00 345/7 |
| 2012/0001842 A1 | 1/2012 | Stellbrink |
| 2012/0081777 A1 | 4/2012 | Heikenfeld et al. |
| 2012/0162238 A1* | 6/2012 | Fleck ....................... G09G 3/20 345/545 |
| 2012/0313857 A1* | 12/2012 | Senananayake ............ G06F 3/016 345/168 |
| 2013/0155034 A1* | 6/2013 | Nakayama ................ G09F 9/35 345/204 |
| 2013/0301287 A1 | 11/2013 | Schlemmer |
| 2014/0211498 A1 | 7/2014 | Cannon et al. |
| 2015/0091859 A1* | 4/2015 | Rosenberg .............. G06F 3/044 345/174 |
| 2016/0070393 A1* | 3/2016 | Sharma .................. G06F 1/163 345/174 |
| 2017/0060298 A1* | 3/2017 | Hwang ................ A61B 5/6807 |

\* cited by examiner

COSMETIC INTEGRATION OF DISPLAYS

This application claims the benefit of provisional patent application No. 62/361,207, filed Jul. 12, 2016, which is hereby incorporated by reference herein in its entirety.

FIELD

This relates generally to components for producing light, and, more particularly, to lighting systems such as covered displays.

BACKGROUND

Systems such as vehicles sometimes include displays. For example, a touch screen display may be used to display navigation system information and media playback information to a user. Display systems such as these may be cumbersome and unsightly.

SUMMARY

A light-based output device may be used to display images, symbols, and other information for a user of a system such as a vehicle. A display may be formed from a display layer, a covering layer that covers the display, and intervening structures such as force and touch sensors and electronic shutters. The covering layer may be formed from leather, fabric, wood, plastic, metal, fiber-composite materials, and other materials. The display or other light-based output component may generate light that passes through the covering layer. The covering layer may have an array of perforations or other openings to allow light to pass from the display and/or may be formed from layers of opaque material such as wood that are sufficiently thin to allow light to pass. The display and covering layer may be located on a dashboard, door panel, or other interior portion of a vehicle or in any other suitable system.

Haptic feedback may be provided using actuators that are coupled to the covering layer. A user may supply touch commands or other input to devices such as touch sensors that overlap the display. In response to receiving a touch command input, control circuitry may use a haptic device to vibrate or otherwise move the covering layer.

A touch sensor may be incorporated into the covering layer and may overlap the display. The touch sensor may also have portions that extend over regions of the covering layer that extend past the region occupied by the display. For example, in a configuration in which the covering layer is formed from fabric, a capacitive touch sensor may have electrodes formed from conductive strands of material in the fabric.

A light modulator such as electronic shutter may be placed in an opaque configuration or other configuration that allows the shutter to serve as a background layer for a transparent display. The light modulator may also be placed in a transparent configuration to allow viewing of an underlying layer such as a layer of fabric. In some configurations, an electronic shutter may overlap a display or other components to obscure these components from view when the display is inactive.

A movable button member may move within an opening in a support structure such as a support structure that forms part of the dashboard. The movable button member may be used to press the covering layer outwardly within an opening, thereby creating a portion of the covering layer that protrudes from other portions of the covering layer. The button member may also be placed in a position in which the covering layer on the button member is flush with other portions of the covering layer.

Further features will be more apparent from the accompanying drawings and the following detailed description.

DETAILED DESCRIPTION

Figure 1:
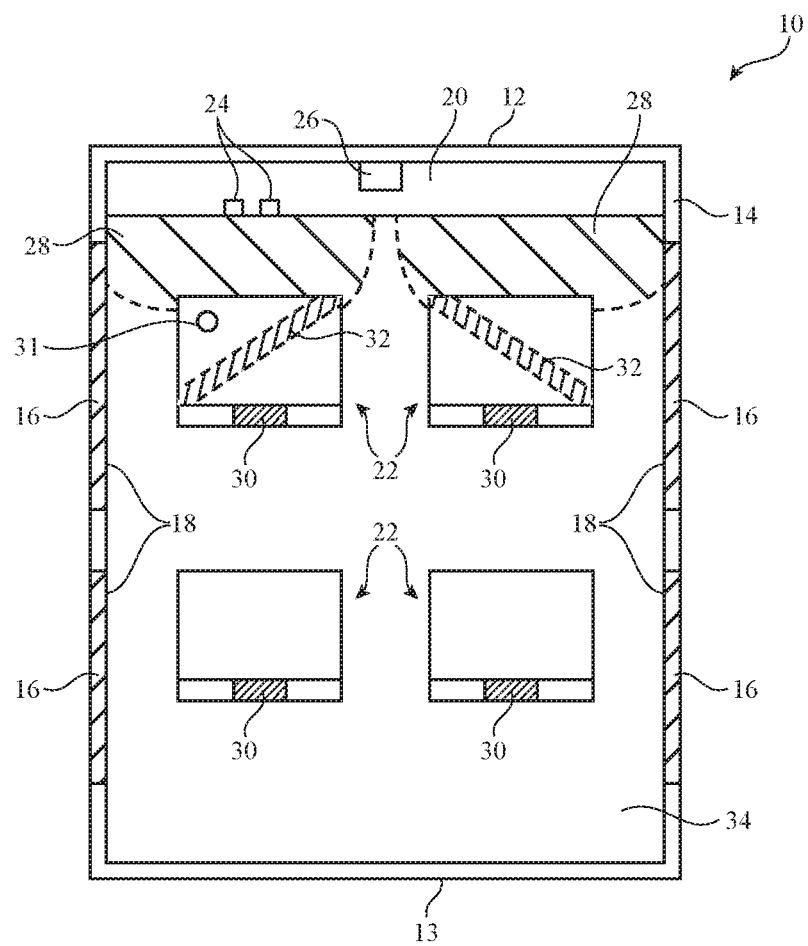
FIG. 1 is a top view of an illustrative system that may have covered displays and other light-based output devices in accordance with an embodiment.

An illustrative system of the type that may be provided with displays and other light-based output devices is shown in FIG. 1. System 10 may be a vehicle, a kiosk, a room in an office or other building, or other environment that includes lighting. Illustrative configurations in which system 10 is a vehicle may sometimes be described herein as an example.

As shown in FIG. 1, system 10 may include windows such as front window 12, rear window 13, and side windows that are mounted in body 14. Body 14 may have doors 16. Surfaces 18 of doors 16 may sometimes be referred to as door panels and face the interior of body 14. Dashboard 20 may be located in front of seats 22 in the interior of body 14. Buttons, dials, and other components 24 (e.g., light-based output devices) may be provided on dashboard 20 and elsewhere in system 10. A camera such as camera 26 and other input-output components may be provided in system 10 and may monitor movements of occupants (users) of system 10. Footwells 28 may be covered with carpeting or other suitable material. Seats 22 may include pressure sensors such as pressure sensor 31 to measure pressure (weight) due to the presence of a driver or other occupants (users) in seats 22. Headrests 30 may be mounted on the rear portions of seats 22. Seatbelts 32 may be used to restrain occupants of system 10 in seats 22.

Light-based output devices (e.g., lighting systems having displays, stand-alone light sources such as light sources based on individual light-emitting diodes, or other light generating components) may be used to display images, may be used to illuminate buttons, may be used to present illuminated symbols to a user of system 10, and may be used to present other lighted content to a user. Light-based output devices in system 10 that are based on arrays of pixels (e.g., light-emitting diodes, etc.) may sometimes be referred to as displays. Light-based devices that are based on single light-emitting diodes or a small number of light-emitting diodes may sometimes be referred to as light sources.

In general, light-based output devices may be used to generate any suitable light output for system 10. For example, light-based output devices may be used to present a user with vehicle status information (e.g., speed, distance traveled, fuel level, etc.), may be used to display navigation information, may be used to display media playback information (e.g., currently playing song title, track number, artist, volume, etc.), may be used to present information on incoming and outgoing telephone calls and text messages, may be used to display alerts, may be used to provide a user with visual feedback on the current state of an associated button (e.g., whether a button is currently pressed or not pressed, etc.), and/or the state of button availability for an associated button (e.g., whether a button is currently available or is not currently available, etc.), and may be used to display other information. This information may include text, static images, moving images (e.g., video for a movie, animated graphics, etc.), may include illuminated symbols (e.g., icons, alphanumeric characters, etc.), or may include other information. In addition to providing information such as text and images to a user with a display, light-based output devices in system 10 may be used to label buttons with text, icons, trim patterns, etc., may illuminate trim for a window, seat, or other component in system 10, or may present a user with other light output.

To help hide internal lighting system components from view and ensure that a display or other light-based output device has an attractive appearance, displays and other light-based output devices may be covered with a covering layer. The covering layer may include one or more layers of fabric, plastic, leather, wood, metal, carbon-fiber composites or other fiber composites, glass, ceramic, other materials, or combinations of these materials (e.g., multiple sublayers of two or more of these materials). As an example, a display may be covered with a thin layer of wood to hide the display from view while allowing light from the display to remain visible to a user or may be covered with a layer of fabric or leather. If desired, additional components such as input devices and/or other output devices may be incorporated into system 10. The covering layer that covers a display may cover only the display (i.e., the footprint of the covering layer and the display may match) or the covering layer and the display may have different shapes and/or sizes (e.g., the covering layer may cover both a display in system 10 and portions of system 10 in addition to the display). This provides designers of system 10 with cosmetic flexibility.

Figure 2:
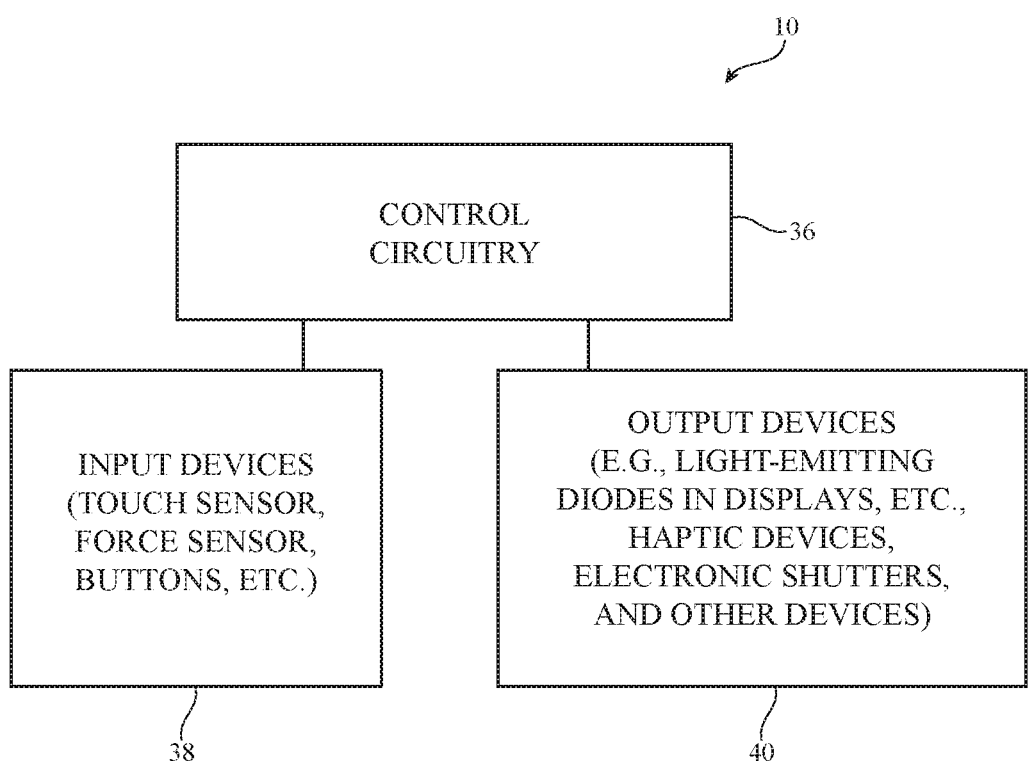
FIG. 2 is a schematic diagram of an illustrative system in accordance with an embodiment.

FIG. 2 is a schematic diagram of system 10 in an illustrative configuration in which system 10 includes input devices 38 and output devices 40. As shown in FIG. 2, system 10 may include control circuitry 36. Control circuitry 36 may include one or more microprocessors, application-specific integrated circuits, digital signal processors, microcontrollers, or other processing circuitry. Control circuitry 36 may also include storage such as volatile and non-volatile memory, solid state drives, hard disk drives, and removable storage media. During operation of device 10, control circuitry 36 may gather input data using input devices 38 and may take suitable actions in response. For example, control circuitry 36 may use output devices 40 to supply output to a user based on the gathered input data. Camera 26 or other sensors in input devices 38 may be used to capture images of a user's face, so that control circuitry 36 can store facial identification data. This allows circuitry 36 to maintain information on the identity of each passenger and the seating location of each passenger in system 10. Camera 26 or other sensors in input devices 38 may also be used to determine which occupants of system 10 are reaching towards a display or taking other actions, may be used control the visibility of a display dynamically (e.g., by turning off a display when the display is not being actively used to conserve power and by turning on the display automatically whenever a user is reaching for the display), and/or may be used in determining when to take other actions in system 10. If desired, camera 26 or other sensors in input devices 38 may be used to calibrate a display. For example, camera 26 may capture images of a display while a test pattern is being produced by the display and control circuitry 36 can use this information to compensate for variations in a covering layer (e.g., wood grain variations) that might affect covering layer light transmission and thereby impart undesired brightness variations to the pixels of the display.

Input devices 38 may include environmental sensors (e.g., sensors that measure temperature, humidity, and air pressure), may include accelerometers, ambient light sensors, magnetic sensors, compasses, and other input devices.

If desired, input devices 38 may include force sensors. For example, devices 38 may include force sensors based on strain gauges, force sensors based on piezoelectric materials, force sensors based on compressible resistive foam, capacitive force sensors (e.g., force sensors based on collapsible foam or fabric with conductive strands that serve as capacitive force sensor electrodes and that can be used in making capacitance measurements as the electrodes deflect towards or away from each other under varying applied force conditions), or other force sensor structures that detect applied force such as applied force from the fingers or other body part of a user.

Devices 38 may include one or more proximity sensors that detect when a user's fingers, other body part, or other external object is in the vicinity of the proximity sensor. The proximity sensors may include light-based proximity sensors formed using light emitters (e.g., infrared light-emitting diodes) and corresponding light detectors (e.g., infrared light detectors). The infrared light detectors may detect infrared light from the infrared light-emitting diodes that has been reflected off of nearby objects. The proximity sensors may also include capacitive proximity sensors (e.g., sensors with capacitive proximity sensor electrodes that make capacitance measurements to detect when objects are nearby), may include acoustic proximity sensors, and/or may include other types of proximity sensors.

Input devices 38 may include touch sensors. The touch sensors may be based on acoustic touch technology, light-based touch technology, resistive touch, force-based touch, or other touch technologies. As an example, the touch sensor(s) may be capacitive touch sensors having capacitive touch sensor electrodes such as electrodes formed from strands of conductive material in a fabric, electrodes formed from strips of metal or other conductive material on dielectric substrates, or electrodes formed from conductive pads with other configurations.

Input devices such as touch sensors, force sensors, and proximity sensors may be used to gather user input. User input may also be gathered using keyboards and other devices with one or more keys or other buttons, joysticks, rotating dials, steering wheels, microphones to gather voice commands and other audio input, and other input components. If desired, one or more of input devices 38 may be assembled with one or more of output devices 40 to form an enhanced-functionality component. As an example, force sensors and/or touch sensors may be combined with displays to form touch-sensitive and force-sensitive displays (sometimes referred to as touch screen displays or displays). Displays such as these and other light-based output devices may be located on a dashboard, door panel, and/or other interior surfaces of system 10.

Output devices 40 may include devices for presenting audio output (e.g., speakers, tone generators, etc.), may include vibrators and other haptic devices, and may include other components for presenting information to a user. Output devices 40 may include displays and other light-based devices. Displays may have arrays of pixels based on light-emitting diodes or other structures for presenting images to a user. Each pixel may have an associated light-emitting diode such as an organic light-emitting diode, a crystalline silicon semiconductor light-emitting diode die, or other adjustable component (e.g., a backlit liquid crystal display pixel in a backlight liquid crystal display, etc.). Devices 40 may also have stand-alone light emitting components such as single-element and multi-element status indicator lights and other light sources. Light sources for arrays of pixels and for stand-alone light emitting components may be formed from organic light-emitting diodes (e.g., diodes formed from thin-film circuitry on a substrate) and/or may be light-emitting diodes formed from crystalline semiconductor dies (sometimes referred to as micro-LEDs or micro-light-emitting diodes). If desired, light sources for lighting systems in devices 40 may include lamps, electroluminescent panels, and other components that generate light.

During operation, control circuitry 36 may generate control signals that direct output devices 40 to generate output for a user. The output may include images and other illuminated content produced by displays and other light-based output devices. Output light may include images (e.g., virtual speedometers and other vehicle gauges, media playback information panels and other information regions, etc.), labels for buttons, icons for status indicator devices, and light that forms other symbols and patterns. Devices 40 may produce haptic feedback (e.g., a covering layer or other portion of a display may be vibrated, etc.), may produce audio output, and/or may produce other output.

Figure 3:
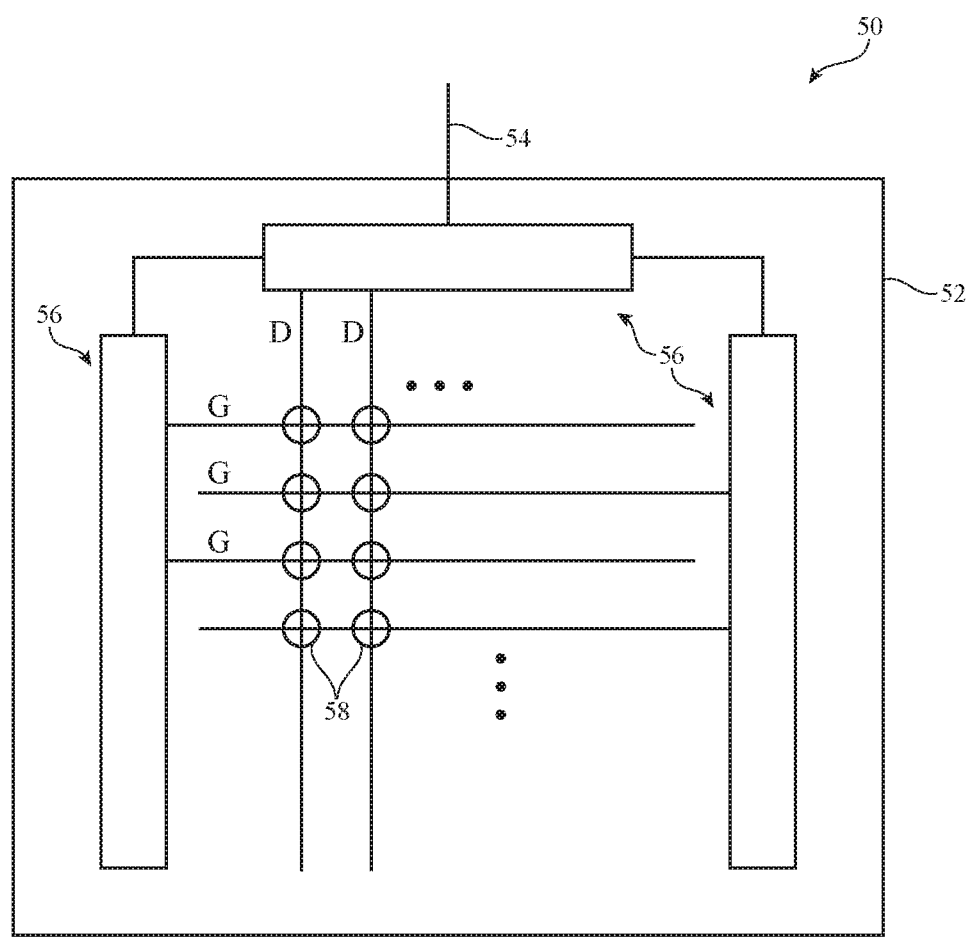
FIG. 3 is a top view of an illustrative display in accordance with an embodiment.

An illustrative display for use in system 10 is shown in FIG. 3. As shown in FIG. 3, display 50 may include an array of pixels 58 on substrate 52. Pixels 58 may be organic light-emitting diodes, may be crystalline semiconductor light-emitting dies, may be light modulating pixels such as liquid crystal display pixels in a liquid crystal display, or may be any other suitable type of pixels. Display 50 may be an organic light-emitting diode display, an electrophoretic display, a display with crystalline semiconductor light-emitting diode dies, an electrowetting display, a microelectromechanical systems (MEMs) display, a liquid crystal display, or other suitable display.

Substrate 52 may be plastic, glass, or other suitable materials. In some configurations, substrate 52 may be transparent (e.g., so that display 50 is transparent) and/or display 50 may contain multiple substrates (e.g., a color filter layer substrate and a thin-film transistor substrate in a liquid crystal display, etc.). Display driver circuitry 56 may include integrated circuits and/or thin-film transistor circuitry on substrate 52. During operation, display driver circuitry 56 may receive image data from control circuitry 36 via path 54 and may supply pixels 58 with data signals on vertical data lines and horizontal control signals (gate line signals) on horizontal gate lines G (sometimes referred to as scan lines, emission enable lines, etc.). This causes the rows and columns of pixels in display 50 to display desired images for a user.

Figure 4:
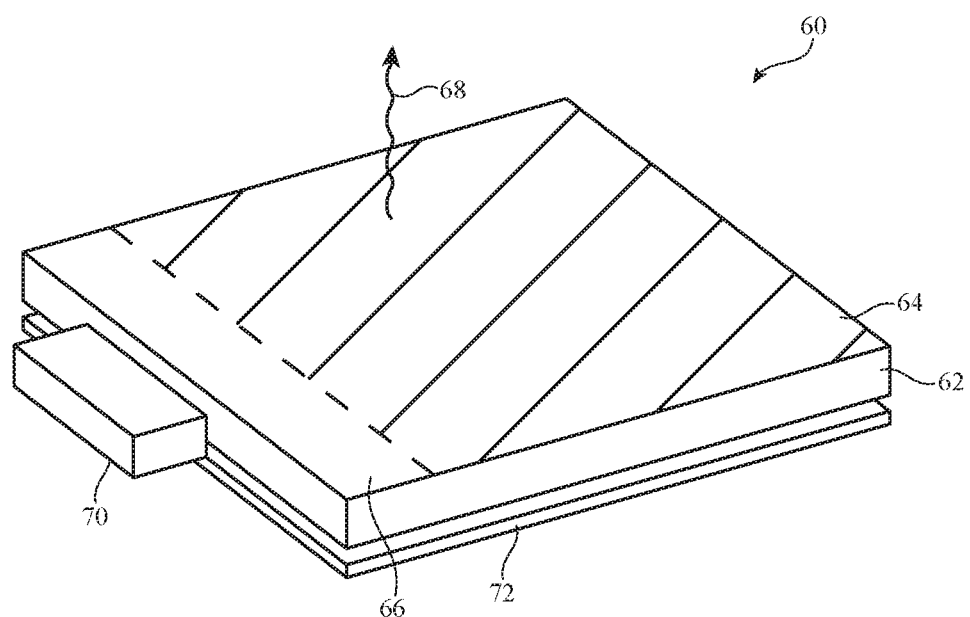
FIG. 4 is a perspective view of an illustrative lighting system having a light guide plate into which light from a light-emitting diode is emitted in accordance with an embodiment.

In some arrangements, it may be desired to illuminate relatively large areas without using a full array of individual adjustable pixels (i.e., without using a display). With one illustrative configuration, illumination may be provided over a relatively large area (e.g., 1 mm×1 mm or more, 1 cm×1 cm or more, less than 10 cm×10 cm, or other suitable area) using a lighting system such as lighting unit 60 of FIG. 4. Lighting unit 60 may have or more light-emitting diodes such as light-emitting diode 70 that emits light into a peripheral edge of light guide layer 62, but does not contain an array of pixels. Light guide layer 62 may be a molded transparent plastic plate, may be a transparent flexible polymer film, or may be other light guide that guides light internally in accordance with the principle of total internal reflection. Light that is traveling within the interior of light guide 62 may be homogenized in light mixing region 66 and may then be extracted from light guide 62 in light extraction region 64 to produce extracted light 68. In light extraction region 64, light guide 62 may have light extraction features on the upper and/or lower surface of light guide 62 that scatter light out of light guide 62. The light extraction features may be formed from pits, grooves, or other recesses, bumps, ridges, or other protrusions, embedded light scattering particles or voids, printed ink patterns, or other light scattering structures. Light that is scattered in the downwards direction of FIG. 4 may be reflected back in the upwards direction by reflector 72. The illustrative thin planar shape of light guide layer 62 of FIG. 4 is merely illustrative. In general, light may be distributed from light sources such as light-emitting diodes using fibers, elongated light guide structures, non-planar light guides, free space light distribution structures, gratings, holographic structures, or other light distribution structures. Diffusers, color filters, and other optical structures may, if desired, be incorporated into a light-based device to color the light that is being emitted by the light-based device (e.g., light 68 of FIG. 4).

To hide unsightly components of input devices 38 and/or output devices 40 (e.g., display components, etc.), the interior surfaces of system 10 or other structures in system 10 may be provided with covering structures. The covering structures may be, for example, covering layers containing one or more layers of material and a total thickness of less than 1 cm, less than 4 mm, less than 2 mm, less than 1 mm, more than 0.1 mm, more than 0.5 mm, more than 1 mm, 0.1 to 1 mm, or other suitable thickness. Covering layers for system 10 may include leather, vinyl and other plastics (polymers), wood, fabric, carbon-fiber composites and other fiber-composite materials, aluminum, stainless steel, and/or other metals, metal mesh structures such as woven metal mesh (fabric formed from metal strands), etc. Metals and other opaque materials may be provided with perforations or other openings to allow light to pass. If desired, materials that would normally be considered opaque (e.g., wood) may be sufficiently thin to allow light to pass (e.g., less than 500 microns thick, less than 50 microns thick, more than 1 micron thick, more than 10 microns thick, etc.). Wood layers may have fibers with short lengths and other attributes (e.g., fiber diameter) that are selected to enhance the quality of images displayed through the wood layers. If desired, plastic with holes, fabric, or other structures with holes may be covered with metal (e.g., using electroforming techniques or other metal forming techniques).

Figure 5:
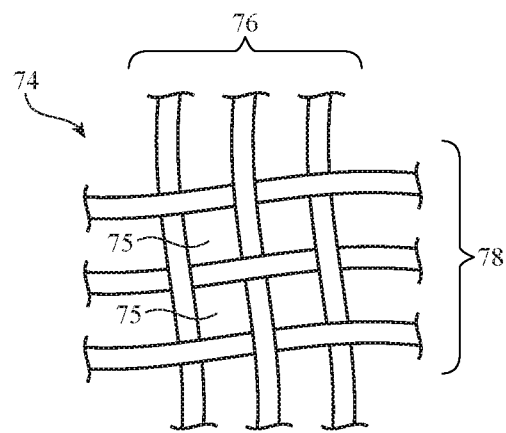
FIG. 5 is a top view of an illustrative fabric covering layer in accordance with an embodiment.

FIG. 5 is a top view of an illustrative covering layer formed from fabric 74. As shown in FIG. 5, fabric 74 may include strands of material such as warp strands 76 and weft strands 78. The strands of material may be formed from monofilaments and/or multifilament yarns. Polymers, metals and other conductive materials, natural materials such as cotton, and other insulating and conductive materials may be used in forming fabric 74. Light from a light-based device may pass through openings 75 between the strands of material in fabric 74.

Figure 6:
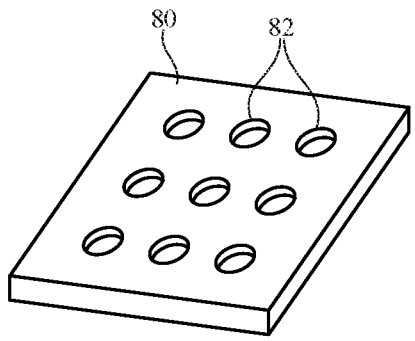
FIG. 6 is a perspective view of an illustrative covering layer with an array of openings such as an array of microperforations in accordance with an embodiment.

FIG. 6 is a perspective view of an illustrative covering layer (layer 80) that has openings 82. Light from a display or other light-based device (e.g., a light guide with a light extraction area, etc.) may pass through openings 82. If desired, openings 82 may be filled with transparent material such as a clear polymer (e.g., polycarbonate, an elastomeric polymer such as silicone, etc.) to block dust and moisture. The opening-filling material may be colored (e.g., dyed), may be translucent, or may have other optical properties (e.g., to help make openings 82 less visible or invisible to a user while still allowing light to pass). Openings 82 may have diameters of less than 1 mm, less than 500 microns, less than 250 microns, less than 100 microns, less than 50 microns, less than 25 microns, less than 5 microns, more than 2 microns, more than 10 microns, 2-500 microns, 2-200 microns, or other suitable size. Openings that are relatively small (e.g., 100 micron diameter openings, which may sometimes be referred to as microperf) may be invisible to the naked eye. Small openings such as these that are unnoticeable to a user may be incorporated into layer 80 without adversely affecting the appearance of layer 80. Layer 80 may be formed from one or more layers of leather, flexible polymer layers such as vinyl and other plastics (polymers), wood, fabric, carbon-fiber composites and other fiber-composite materials, etc. Openings 82 may form solid blocks that form symbols (text characters, icons, etc.), may form outlines for symbols, may form decorative patterns, may have location-dependent density (in opening count and/or total opening area per unit area), or may be arranged in other patterns.

Figure 7:
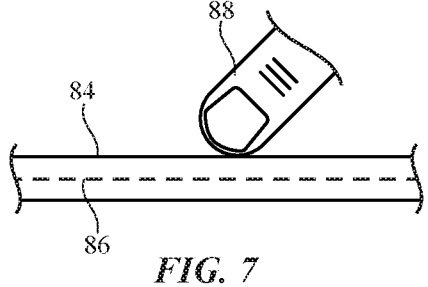
FIG. 7 is a side view of an illustrative force sensor such as a strain gauge sensor in accordance with an embodiment.

Input devices 38 may include force sensors. FIG. 7 is a cross-sectional side view of an illustrative force sensor in which force sensor circuitry (e.g., metal traces 86 that form one or more thin-film strain gauges) is formed on layer 84. Layer 84 may be formed as part of a covering layer (e.g., a covering layer for a display or other light-based device) or other layer in a display or other light-based system. When pressed by user's finger 88, strain gauges 86 may detect a force input (e.g., an input proportional to the amount of force exerted by the user). Control circuitry 36 may process this input (in addition to other input such as touch sensor input).

Figure 8:
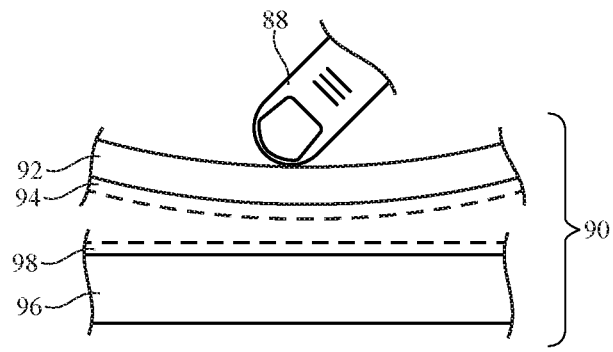
FIG. 8 is a side view of an illustrative force sensor such as a capacitive force sensor in accordance with an embodiment.

FIG. 8 is a cross-sectional side view of an illustrative capacitive force sensor. Force sensor 90 of FIG. 8 has an upper layer such a layer 92 and a lower layer such as layer 96. Electrodes 94 and 98 may be formed on the surfaces of layers 92 and 96. Layers 94 and 98 may form electrodes in a capacitor. When layer 92 is pressed inwardly by finger 88, the capacitance associated with the capacitor increases and can be converted into a force input value.

If desired, other types of force sensors may be used in system 10 (e.g., piezoelectric sensors, force sensors based on compressing fabric that contains capacitive electrodes such as electrodes 94 and 98 formed from conductive strands of material, etc.). The examples of FIGS. 7 and 8 are merely illustrative.

Figure 9:
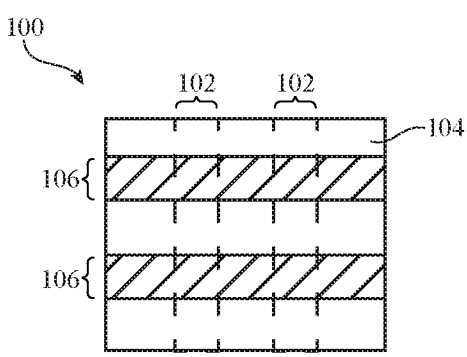
FIG. 9 is a top view of an illustrative capacitive touch sensor in accordance with an embodiment.

FIG. 9 is a top view of an illustrative touch sensor. Touch sensor 100 of FIG. 9 is a capacitive touch sensor. The upper side of substrate 104 has a series of horizontally extending strips 106 and the lower side of substrate 104 has a series of vertically extending strips 102. Strips 106 and 102 may serve as capacitive touch sensor electrodes. Strips 106 may serve as drive lines and may receive drive signals from a touch sensor circuit. Strips 102 may serve as sense lines. The location of a user's touch (e.g., a finger covering one of the intersections between strips 102 and 106 in sensor 100) may be determined by the touch sensor circuit, which monitors signals on the sense lines. If desired, a fabric covering layer (e.g., layer 74 of FIG. 5) may have a grid of conductive strands that serve as capacitive touch sensor electrodes. Other strands in the fabric may be insulating. Touch sensors may also be formed using acoustic touch components, light-based touch components, and other touch sensor components. The use of capacitive touch sensors is merely illustrative.

If desired, touch sensors, force sensors, displays, and additional layers (e.g., haptic layers) may be mounted in a common location under a covering layer (e.g., a covered display or other light-based output device may be provided with force sensing, touch sensing, and/or haptic capabilities). As shown by illustrative display 50 of FIG. 10, the output from a display (e.g., the output light that passes through openings in a fabric, perforations in covering layers, or that otherwise is presented to the user) may include content such as text 108 and graphics 110. Images that are presented by display 50 may be static, may be moving (e.g., moving graphic patterns or other video), may include color and/or black and white content, may include symbols, labels, instructions, media information, navigation information, vehicle status information, and other suitable information.

Figure 10:
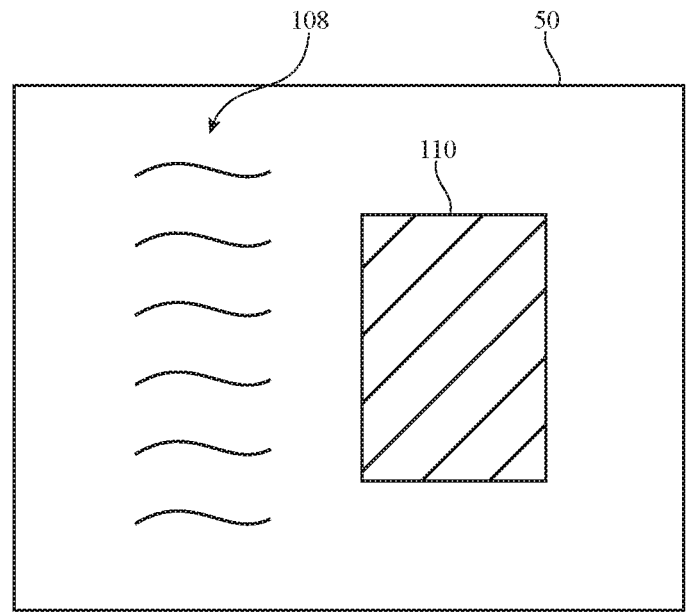
FIG. 10 is a top view of an illustrative display in accordance with an embodiment.
Figure 11:
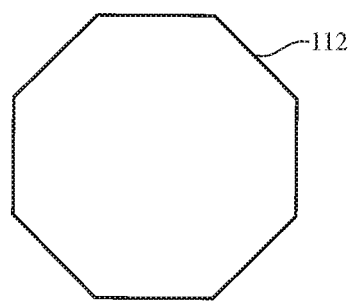
FIG. 11 is a top view of an illustrative light-based device with a light guide plate or other light-emitting structures that emit light in the shape of a symbol in accordance with an embodiment.

In some configurations (e.g., when using a light guide to distribute light from a light-emitting diode or small group of light-emitting diodes over a relatively large area), it may be desirable to form a mask or light extraction feature shape in the shape of a symbol. This type of arrangement is shown by illustrative illuminated symbol 112 of FIG. 11. In general, light-based devices may produce illuminated output with any suitable content (symbol shapes, text, images, etc.). The examples of FIGS. 10 and 11 are illustrative.

Figure 12:
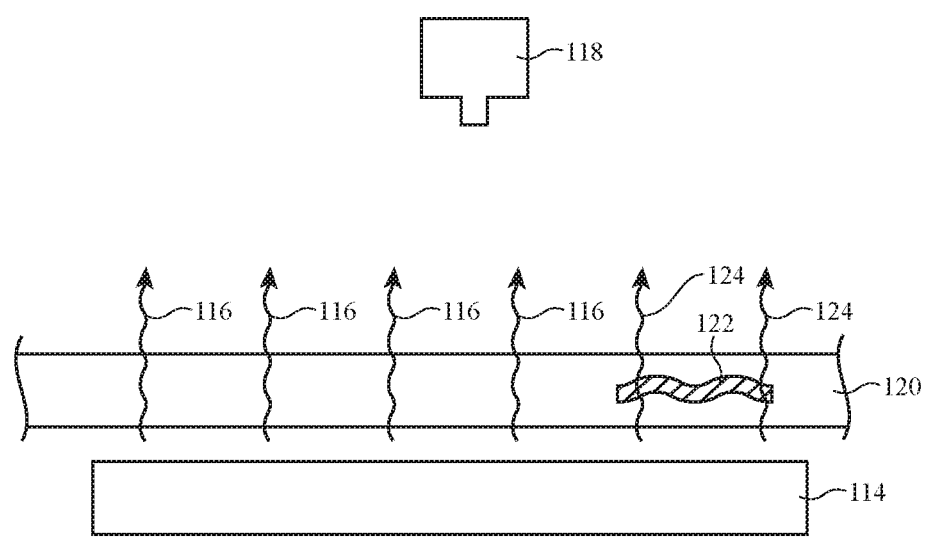
FIG. 12 is a cross-sectional side view of an illustrative covered display during calibration operations to compensate for variations in light transmission through different portions of a covering layer in accordance with an embodiment.

FIG. 12 is a cross-sectional side view of a covered display in which the covering layer may be solid (i.e., in which the covering layer need not contain openings such as openings 75 of FIG. 5 or openings 82 of FIG. 6). In the FIG. 12 example, display 114 is emitting light that passes through covering layer 120 and is free of microperf openings and other light openings. Layer 120 may be a layer of leather, plastic, wood, fiber composite material, or other material. As an example, layer 120 may be a wood layer that is sufficiently thin to allow light from the pixels of display 114 to pass to a viewer.

Wood and other materials may have localized variations in transmittance. For example layer 120 may include dark material 122 (e.g., dark portions associated with wood grain, etc.). This may dim and/or discolor the light that is passing through material 122. To compensate for these intensity variations and/or color casts, covered display 114 may be calibrated. As an example, a camera such as camera 118 (a camera in a manufacturing facility or a camera such as camera 26 in system 10 that can gather real time images of layer 120) may monitor the light that is passing through layer 120 and can supply control circuitry 36 with compensating calibration data. In the example of FIG. 12, some of the light from display 114 (i.e., light 116) passes through layer 120 without a significant reduction in intensity or change in color, whereas other light from display 114 (e.g., light 122) may be changed in intensity and/or color due to passage of light 124 through the portion of covering layer 120 that contains material 122. Camera 118 can capture an image of the light exiting display 114 when display 114 is emitting a known test pattern of light and can provide appropriate compensation data to control circuitry 36. Following calibration operations (i.e., during normal operation), control circuitry 36 can use the calibration data to adjust the intensity and/or color of light emitted by each of the pixels in display 114, thereby ensuring that the images presented to a user through layer 120 will be unaffected by spatial variations in the light transmittance and color of layer 120.

In darker areas of layer 120, more light is occluded, so display pixel brightness will be reduced. To ensure that each pixel in the display has at least a minimum brightness level, the overall brightness of the display may be increased. Some types of display (e.g., organic light-emitting diode displays) may exhibit lifetimes that are proportional to pixel brightness and pixel on time. In order to avoid burn-in of pixels in darker (less transmissive) areas of the covering layer, the position of the display with respect to the covering layer can be varied over time and the display recalibrated accordingly using camera 118. With one illustrative arrangement, the position of the display is shifted relative to the covering layer during normal servicing of system 10. With another illustrative arrangement, the position of the display may be shifted by mounting the display on a support structure with a high coefficient of thermal expansion in the axes parallel to the display surface. If desired, an actuator may be included in system 10 that moves the display along one or more of the axes parallel to the display surface. When moving the display during servicing, calibration operations may, if desired, be performed with an external camera (e.g., a camera in a service facility) in addition to or instead of using a camera in system 10. Calibration operations based on thermally induced display movements and/or actuator-based display movements may be performed in real time or during servicing in a service facility (e.g., a service facility that produces a range of temperatures to create corresponding lateral display movements, a service facility that produces actuator control commands for the actuators that position the display, etc.).

Figure 13:
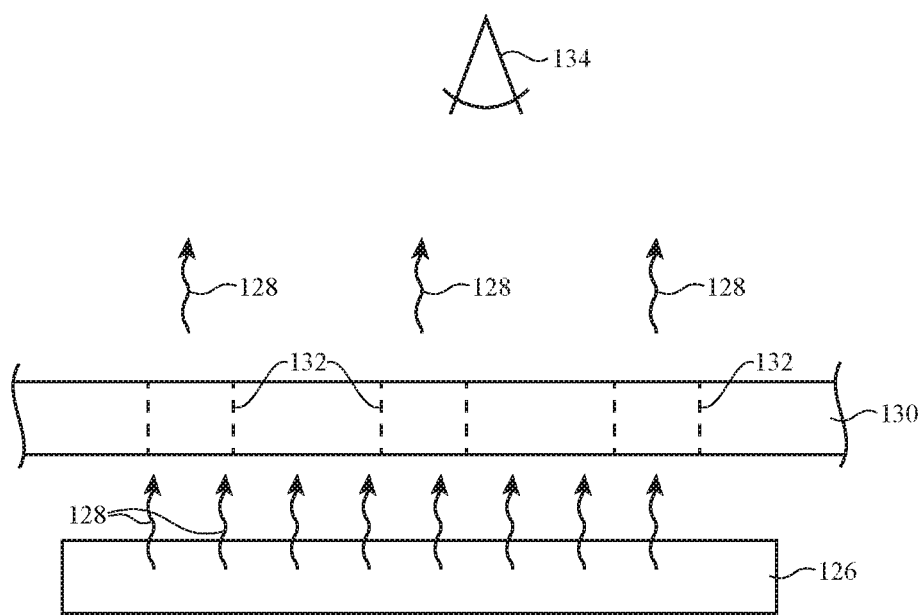
FIG. 13 is a cross-sectional side view of an illustrative covered display having a covering layer with openings through which light from a display or other light source passes in accordance with an embodiment.

FIG. 13 shows how display 126 may emit light 128 that travels to viewer (user) 134 through openings 132 in covering layer 130. Openings 132 may be openings such as openings 75 in fabric 74, openings 82 in layer 80 of FIG. 6, or other openings in a covering layer. The density of openings 132 (e.g., the number and/or size of openings 132 in a given area) may be adjusted as a function of position in display 126 (e.g., to even out luminance and/or color variations due to the properties of layer 130, to create intentional luminance hotspots, etc.)

Figure 14:
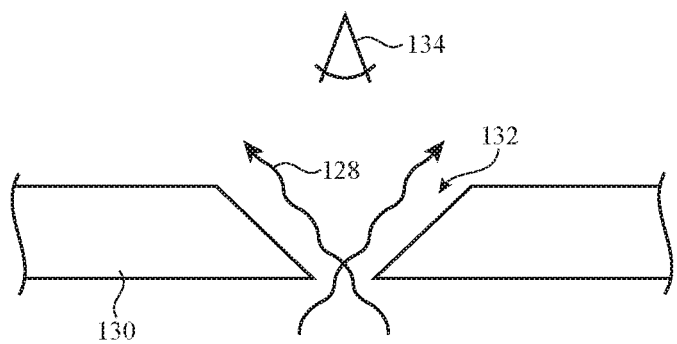
FIG. 14 is a cross-sectional side view of a portion of an illustrative covering layer with an opening that tapers outwardly at its outer surface in accordance with an embodiment.
Figure 15:
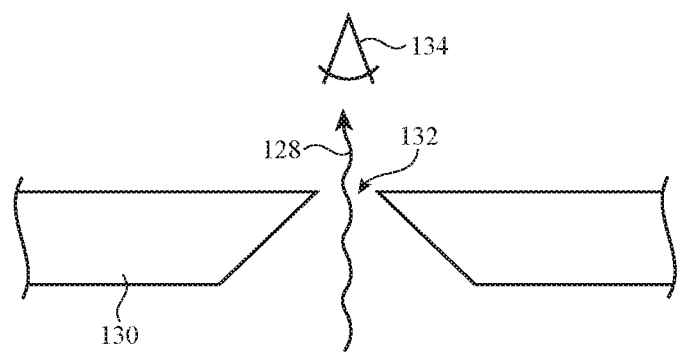
FIG. 15 is a cross-sectional side view of a portion of an illustrative covering layer with an opening that tapers inwardly at its outer surface in accordance with an embodiment.
Figure 16:
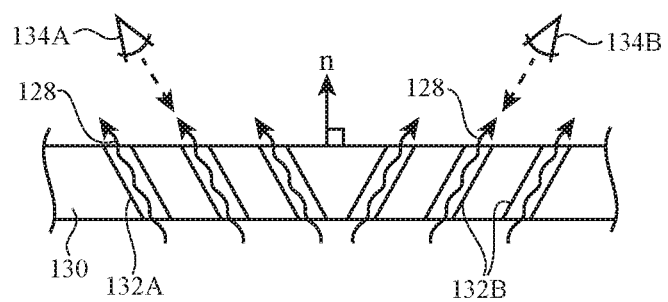
FIG. 16 is a cross-sectional side view of a portion of an illustrative covering layer having sets of openings that are directed at different angles with respect to a surface normal for the covering layer to accommodate viewing by users at different viewpoints in accordance with an embodiment.
Figure 17:
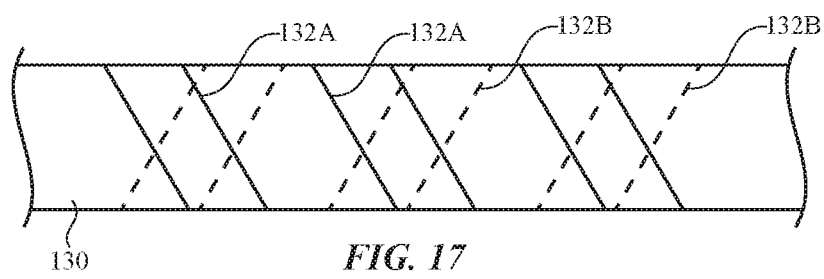
FIG. 17 is a cross-sectional side view of a portion of a covering layer having sets of differently oriented openings that overlap respective alternating rows of a display in accordance with an embodiment.

As shown in FIG. 14, openings 132 may taper outwardly as openings 132 pass through layer 130 towards user 134. This type of opening profile may ensure that the display is characterized by a wide angle of view. In the example of FIG. 15, openings 132 taper inwardly as openings 132 pass through layer 130 towards user 134. This type of arrangement may help hide openings 132 from view. In the configuration of FIG. 16, display has openings 132A and 132B that are oriented at different angles with respect to surface normal n of layer 130. Openings 132A are oriented toward user 134A (e.g., a driver of a vehicle) and openings 132B are oriented toward user 134B (e.g., a passenger of the vehicle). Light 128 from pixels of display pass either to user 134A or to user 134B depending on which set of openings is aligned with the pixels. If desired, alternating rows of a display may be aligned with openings 132A and 132B, respectively, as shown in FIG. 17. In these arrangements, control circuitry 36 may use knowledge of the orientation of each opening in layer 130 to determine which pixels to use in presenting images (e.g., pixels in odd rows for presenting images in one direction through openings 132A and pixels in even rows for presenting images in another direction through openings 132B in the example of FIG. 17). Different columns (e.g., alternating columns), diagonal rows (e.g., alternating diagonal rows), and/or other sets of openings may also be associated with different opening orientations. In this way, control circuitry 36 may ensure that appropriate content is provided to each user (e.g., moving images for a passenger and static content for a driver, etc.).

Figure 18:
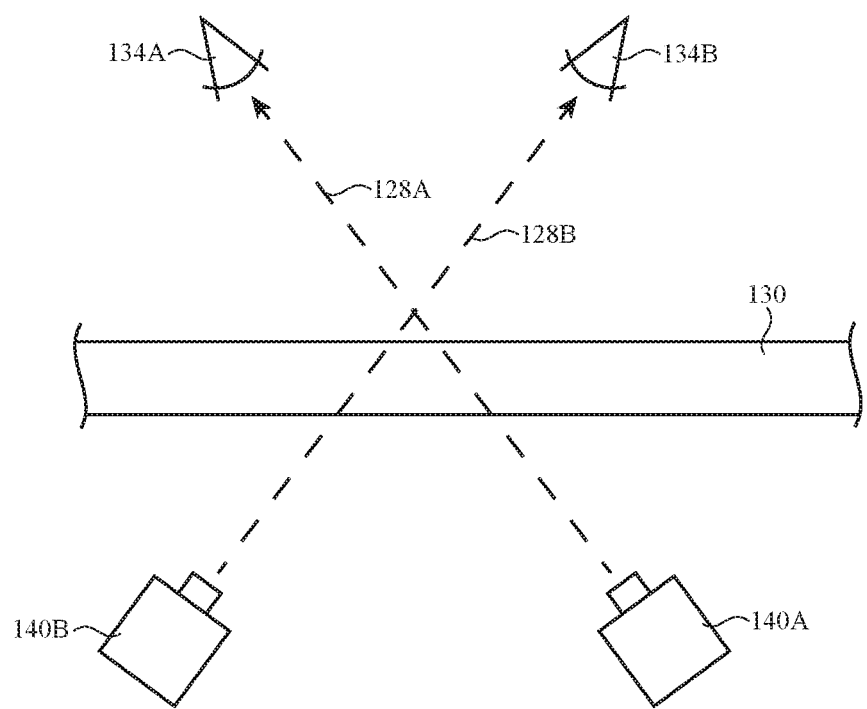
FIG. 18 is a cross-sectional side view of a projection system that project images through a covering layer in multiple directions in accordance with an embodiment.

If desired, different users (e.g., passenger and driver) may be presented with different light output using a system of the type shown in FIG. 18. In the FIG. 18 example, user 134A receives light 128A through covering layer 130 from light source 140A (e.g., a projector, a display with a backlight unit that emits illumination in a first direction, etc.), whereas user 134B receives light 128B through covering layer 130 from light source 140B (e.g., another projector, a display with a backlight unit that emits illumination in a second direction, etc.). Layer 130 may have directional openings such as openings 132A and 132B of FIG. 17, may have other types of openings, may be sufficiently thin to be transparent, or may have other suitable configurations. Layer 130 may be formed from fabric, leather, wood, plastic, metal, fiber-composites, or other covering layer materials.

Figure 19:
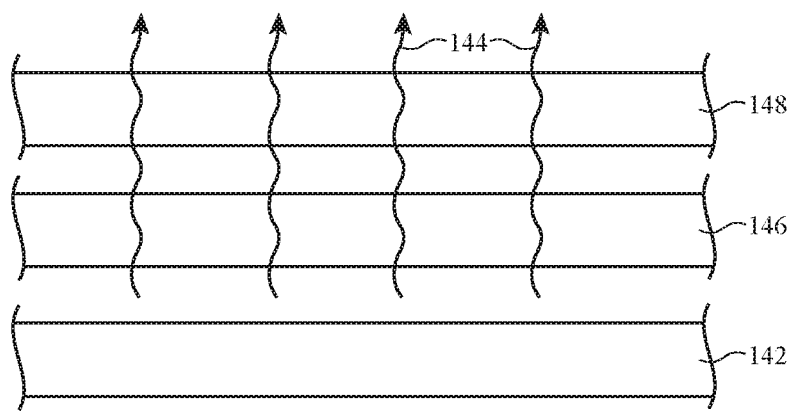
FIGS. 19 and 20 are cross-sectional side views of a covered display having an adjustable light modulator layer that is interposed between a display layer and a covering layer in accordance with an embodiment.

FIG. 19 is a cross-sectional side view of a light-based device such as a display in an illustrative configuration in which an optical modulator (sometimes referred to as an electronic shutter) is interposed between a display layer and a covering layer. As shown in FIG. 19, display layer (display) 142 may emit light 144. Display layer 142 may have an array of pixels for displaying images or may have a smaller number of larger light emitting areas for displaying light output in predetermined shapes (as examples). Electronic shutter 146 may be a light modulator that is operable in transparent and opaque (or translucent) states. Electronic shutter 146 may be include electrostatically controlled bendable microlouvers, may be a suspended particle device, may be a microelectromechanical systems light modulator, may be a liquid crystal modulator such as a polymer dispersed liquid crystal (PDLC) device or other liquid crystal shutter, may be an electrochromic shutter, or may be any other suitable light modulator with multiple optical states (e.g., a more transmissive state such as a transparent state and a less transmissive state such as an opaque state, a first state in which the shutter is transparent (low haze) and a second state in which the shutter is translucent and exhibits more haze than in the first state, etc.). Shutter 146 preferably is pixel free and is sufficiently large to cover most or all of display layer 142.

Figure 20:
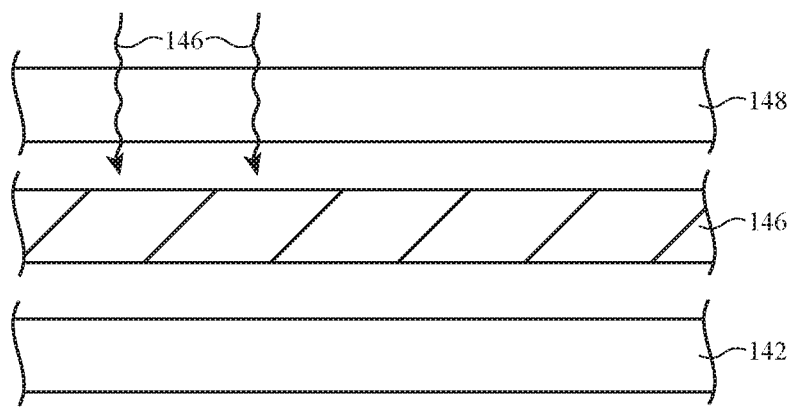

Covering layer 148 may have openings or may be sufficiently thin to allow light 144 to pass and may be formed from any suitable covering layer material (e.g., fabric, leather, wood, plastic, metal, fiber-composites, etc.). During light output operations, control circuitry 36 directs display 142 to generate images or other light 144 and places electronic shutter 146 in its transparent state. As shown in FIG. 19, this allows a user to view light 144 through covering layer 148. When it is desired to turn off display 142, shutter 146 may be placed in its opaque state (or other non-transparent state such as a translucent state). As shown in FIG. 20, shutter 146 may block external light 146 in the non-transparent state and thereby obscure internal components such as display 142 from view. By obscuring reflecting structures and other structures in display 142 from view, shutter 146 of FIG. 20 may help improve the appearance of covering layer 148 (e.g., covering layer 146 may appear darker than would otherwise be possible, etc.).

Figure 21:
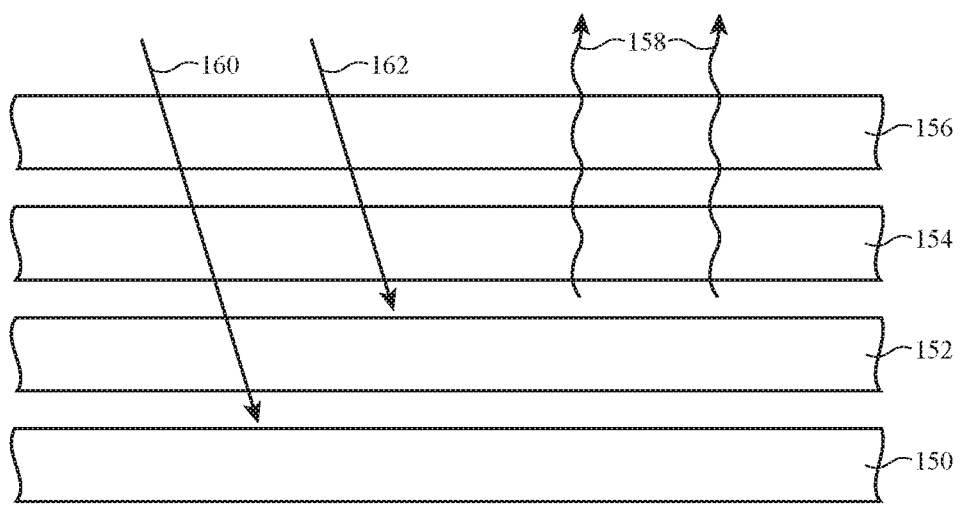
FIG. 21 is a cross-sectional side view of an illustrative display in which a transparent display layer (transparent display) is interposed between an adjustable light modulator and a covering layer in accordance with an embodiment.

In the illustrative configuration of FIG. 21, covering layer 156 covers a transparent display layer (display) 154. Electronic shutter 152 may be interposed between transparent display 154 and background layer 150. Display 154 may be a transparent organic light-emitting diode display or other transparent display. Covering layer 156 and background layer 150 may be formed from any suitable covering layer materials (e.g., fabric, leather, wood, plastic metal, fiber-composites, etc.). Covering layer 156 may be sufficiently thin to allow light 158 from the array of pixels in display layer 154 to pass and/or may have openings to allow light 158 to pass. In a first mode (e.g., an active display mode), display 154 may be used to generate light 158 (e.g., to display images, symbols, etc. for a user). In the first operating mode, shutter 152 may be placed in its opaque state or other non-transparent state so that external light 162 is blocked by shutter 152 (e.g., shutter 152 may serve as a dark background layer or other non-transparent background layer for transparent display 154). In a second operating mode (e.g., an inactive display mode), display 154 is turned off and is transparent. External light 160 may pass through layers 156, 154, and 152 and may illuminate layer 150. This allows a user to view layer 150 through layer 156, thereby enhancing the appearance of covering layer 156. As an example, layer 156 may be a sheer fabric layer and layer 150 may be an opaque fabric. When display layer 154 is generating images, shutter layer 152 may be non-transparent (e.g., opaque or translucent), which may help a user view the images on display 154 without influence from the appearance of layer 150. When display 154 is not generating images, layers 154 and 152 will be transparent and the appearance of fabric layer 150 (which may be, for example, an opaque fabric with a distinctive texture) can help ensure that covering layer 156 has an attractive appearance.

Figure 22:
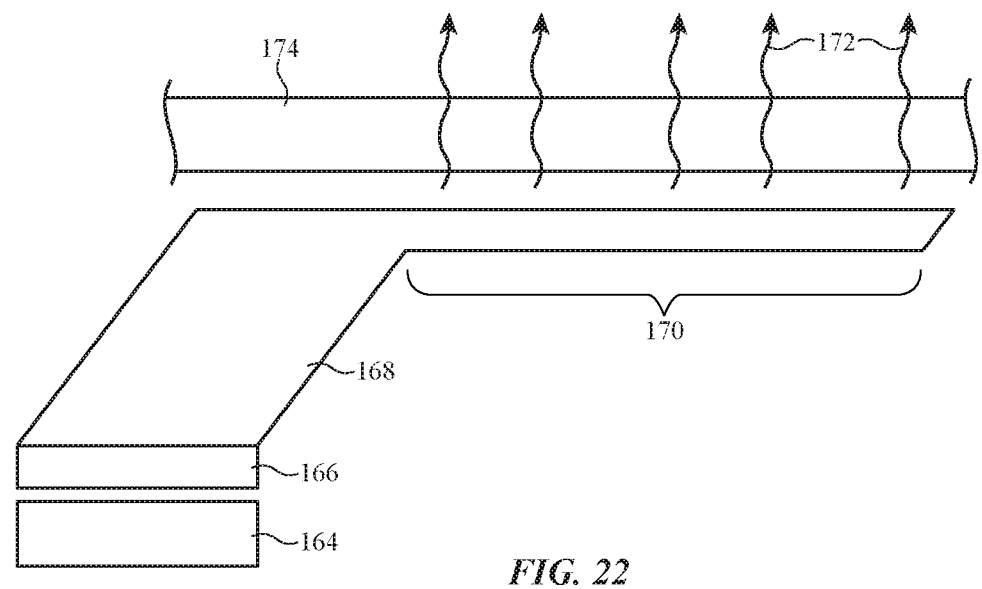
FIG. 22 is a cross-sectional side view of an illustrative covered display having a light distribution structure that distributes image light from a display component in accordance with an embodiment.

In the illustrative arrangement of FIG. 22, light 172 is emitted through the portion of covering layer 174 that overlaps light emission portion 170 of light guiding structure 168. Images or other light may be generated by display 164 and may be coupled to a light steering portion of light guiding (light guide) structure 168 using optical coupling structures 166 (e.g., lenses, etc.). Covering layer 174 may be formed from fabric, leather, wood, plastic, metal, fiber-composite material, or other suitable material(s) and may be sufficiently thin to allow light 172 to pass and/or may have openings to allow light 172 from light guide 168 to pass for viewing by a user. Space may be constrained in system 10, so it may be desirable for the portion 170 of light guide 168 from which light 172 is emitted to be relatively thin. Layer 170 may, as an example, be a light guide plate having embedded prisms, holographic light extraction structures, or other suitable structures for directing light 172 out of portion 170 of light guide 168 through layer 174. This type of arrangement allows thin region 170 to be mounted in portions of system 10 in which space is constrained.

Figure 23:
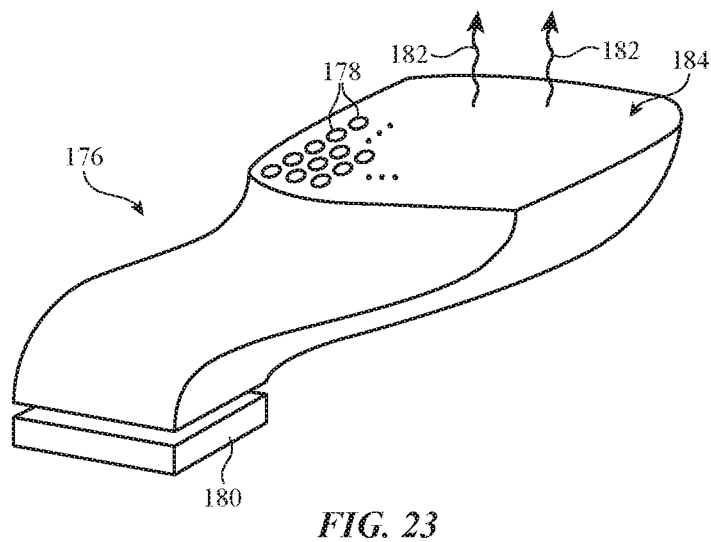
FIG. 23 is a perspective view of an illustrative coherent light guide bundle in accordance with an embodiment.

FIG. 23 is a perspective view of another illustrative light guiding scheme for distributing light from a display through a covering layer. The covering layer is not shown in the drawing of FIG. 23 to avoid obscuring light guide 176. In the configuration of FIG. 23, display 180 generates images or other light. Light guide 176 is formed from a coherent fiber bundle having an array of transparent fibers 178 (e.g., fibers formed from plastic, glass, etc.) that guides light from display 180 and emits this light as light 182 from the ends of the fibers 178 in the array of fibers at surface 184 of light guide 176. A covering layer can be formed over fiber bundle exit surface 184.

Figure 24:
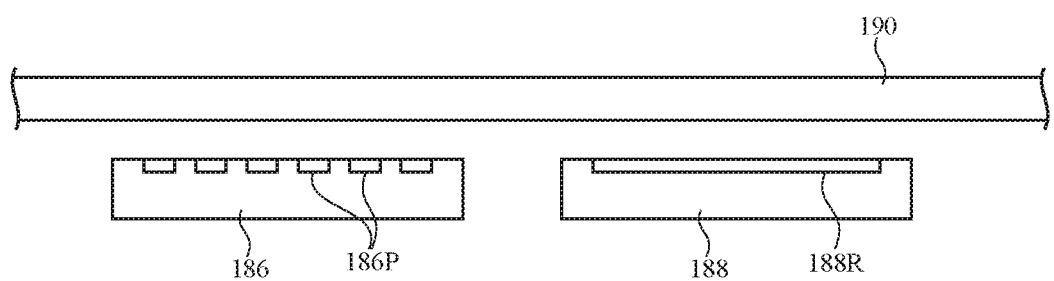
FIG. 24 is a cross-sectional side view of an illustrative segmented lighting system having a display with an array of pixels and having a stand-alone light-emitting component in accordance with an embodiment.

As shown by the illustrative light-based device of FIG. 24, different regions of the output area of a lighting system may have different light output devices. This type of arrangement, which is sometimes referred to as a segmented light output area arrangement, may allow inactive light output devices or inactive portions of light-based output devices to be powered off when not in use to conserve power. Due to the presence of covering layer 190 (e.g., fabric, leather, wood, plastic, metal, fiber-composite material, etc.), the appearance of the output surface may be attractive and uniform even when only a subset of the available light output devices are being used.

In the FIG. 24 example, light output device 186 is a display having an array of pixels 186P for displaying images through covering layer 190, whereas light output device 188 has only a single light-emitting component (e.g., a light-emitting diode, electroluminescent device, or edge-fed light guide plate that emits light in light-emitting region 188R, which may be in the shape of a symbol). In general, a light-based output device with a covering layer and a segmented light output area may have any suitable number of light generating devices and these devices may be displays (e.g., displays with arrays of pixels for displaying images, displays with electronic shutters such as the displays of FIGS. 19, 20, and 21, etc.), light-emitting diodes, lamps, single-element or multi-element status indicators, symbol-shaped light sources, etc. Segmented area light-based devices may display images, symbols, labels, instructions, and/or other illumination over any suitable surfaces in system 10 (e.g., dashboard surfaces, door panel surfaces, and other interior surfaces of system 10 that are covered with covering layers 190). Covering layer 190 may have openings and/or thin transparent (semi-transparent) regions. A top view of an illustrative segmented light-based output device having three different light output devices 192, 194, and 196 (e.g., displays, single-element light sources, etc.) under a common covering layer such as covering layer 190 is shown in FIG. 25.

Figure 25:
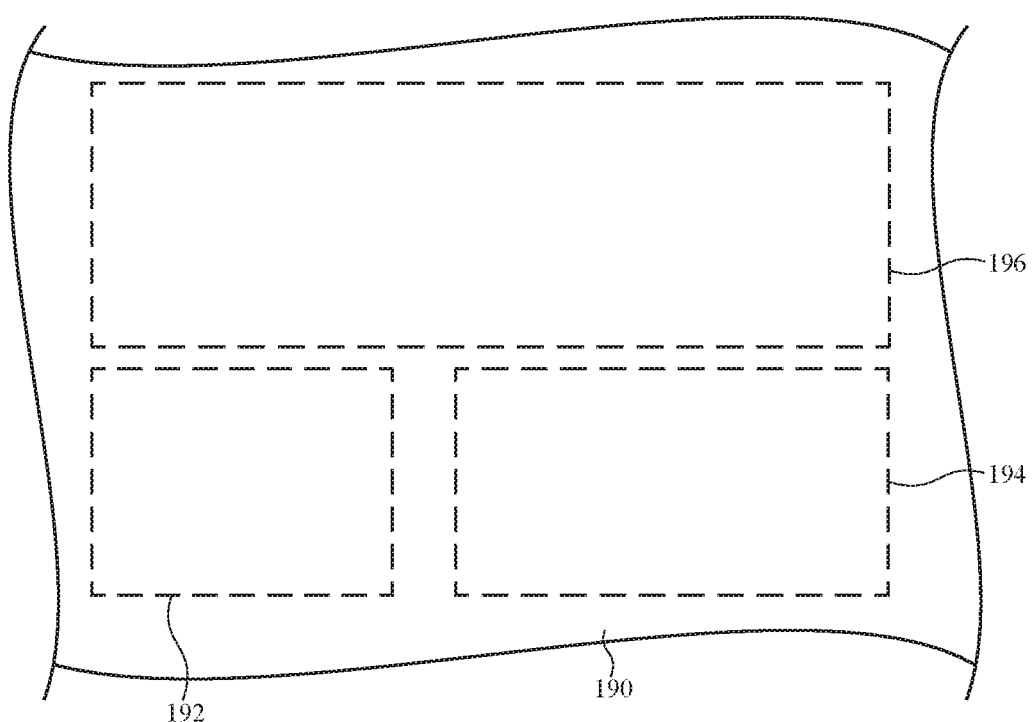
FIG. 25 is a top view of an illustrative segmented lighting system covered by a common covering layer in accordance with an embodiment.

If desired, a single light output device may be used to provide light output in more than one region (see, e.g., the regions associated with devices 192, 194, and 196 of FIG. 25) and that single device may be provided with a segmented backlight (e.g., a first light guide that can be turned on or turned off in one area and a second light guide that can be independently turned on or turned off in another area, etc.). When all areas are in use, all of the backlights can be used and the entire display can be backlit. When only portions of the display are being used, unneeded backlights can be turned off to conserve power.

Figure 26:
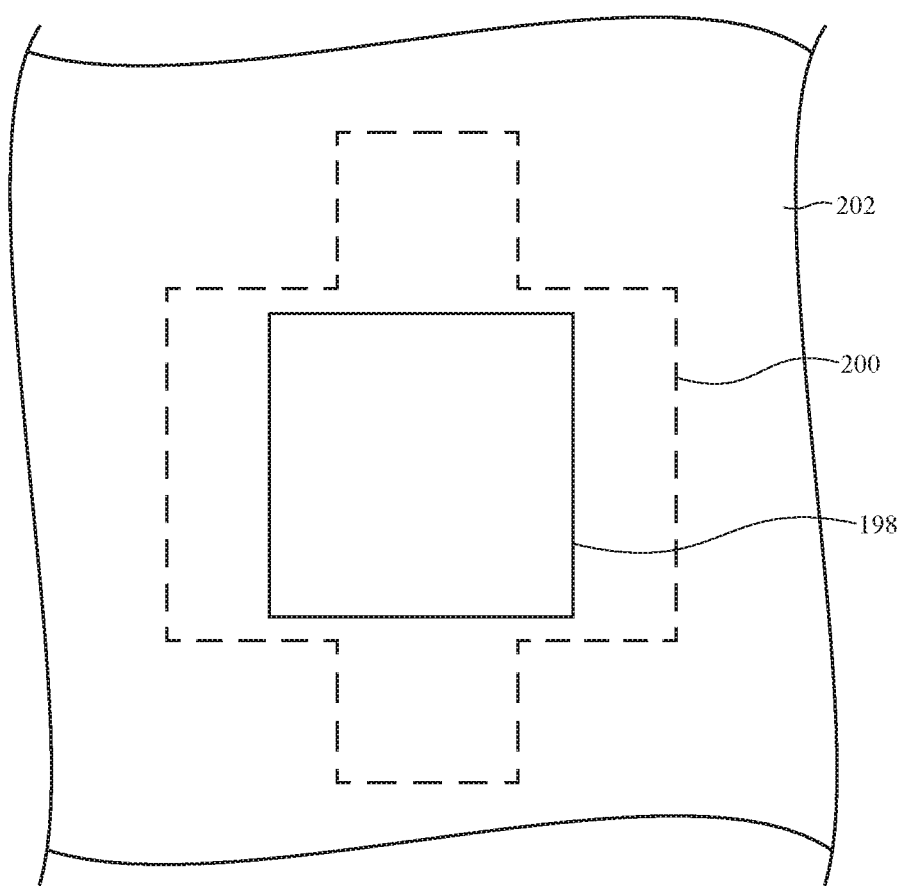
FIG. 26 is a top view of an illustrative display and associated touch sensor in accordance with an embodiment.

If desired, capacitive touch sensors, force sensors, and/or other sensors may be configured to have a footprint that differs from an underlying light-based output device. Consider, as an example, the arrangement of FIG. 26. As shown in FIG. 26, display 198 may have a rectangular footprint (outline). Sensor 200 may overlap some or all of display 198. In the example of FIG. 26, sensor 200 has a footprint that completely overlaps display 198. In particular, the central portion of sensor 200 overlaps display 198 completely and the peripheral portions of sensor 200 extend to other regions of covering layer 202 and do not overlap display 198.

Sensor 200 may have dimensions that extend beyond those of display 198 to accommodate gestures and other touch input (and/or force input or other input) that spans an area larger than display 198. This may help a user supply input without being constrained to a relatively small display area. Sensor 200 may be formed on a dielectric substrate layer that is interposed between display 198 and covering layer 202 or may be formed as part of covering layer 202 (as examples). For example, covering layer 202 may be a plastic or glass layer and an array of capacitive touch sensor electrodes such as transparent conductive electrodes of indium tin oxide may be formed on a transparent substrate layer that is interposed between display layer 198 and covering layer 202. As another example, covering layer 202 may be formed from insulating fabric with a grid of embedded conductive strands that form drive and sense lines for a capacitive touch sensor. A force sensor (e.g., a capacitive force sensor with conductive strands that serve as electrodes) or other sensors may also be integrated into a fabric that forms covering layer 202, if desired.

If desired, haptic devices may be used to provide a user with force feedback (e.g., vibrations, etc.). Examples of haptic devices that may be used to provide a user with a vibration or other tactile output are electromagnetic actuators such as solenoids, motors, piezoelectric crystals, electroactive polymers, and other structures generate a vibration and/or otherwise move structure to create haptic output for a user. As an example, the surface of a covering layer may be vibrated in response to touch input from a user to produce a physical "click." This creates an illusion for the user that the user has clicked on a mechanical clicking structure (e.g., a mechanical switch with a spring, etc.). If desired, haptic devices may be used that include springs and other mechanical haptic structures. The use of an electrically controllable haptic device is merely illustrative.

Figure 27:
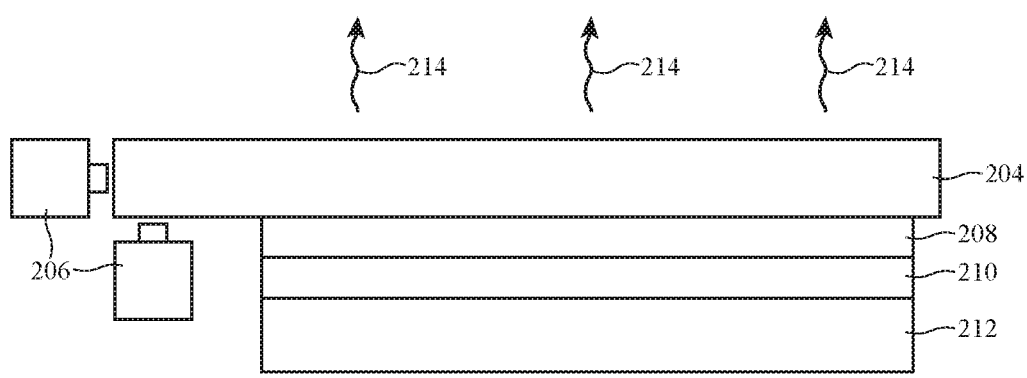
FIG. 27 is a cross-sectional side view of an illustrative display having force and touch sensors in accordance with an embodiment.

In the configuration of FIG. 27, one or more haptic devices 206 (e.g., solenoids or other electrically controllable devices, mechanical devices based on springs, etc.) may be coupled to covering layer 204. Haptic devices 206 may be actuated in response to touch input events, in response to force inputs, may be actuated in response to other suitable events, etc. Display 212 may be a projector, an organic light-emitting diode display, a liquid crystal display, or other display (see, e.g., display 50 of FIG. 3) and/or may contain light guides (e.g., light guide 64 of FIG. 4) and/or other structures for generating light in the shape of symbols, etc. Touch sensor 208 (e.g., a capacitive touch sensor) may be used to gather touch input from a user. Touch sensor 208 may be formed form a stand-alone touch sensor layer or may be incorporated into covering layer 204 (e.g., by incorporating conductive strands into a fabric as described in connection with FIGS. 5 and 9, etc.). Force sensor 210 may be interposed between touch sensor 208 and display 212 or may be incorporated into layer 204 (e.g., when layer 204 is a fabric). Force sensor 210 may be based on a strain gauge arrangement of the type described in connection with FIG. 7, may be based on a capacitive touch sensor arrangement of the type shown in FIG. 8, or may be based on other suitable force sensing structures. If desired, electronic shutters may be interposed between display 212 and covering layer 204 and/or between display 212 and a background layer (not shown in FIG. 27). The configuration of FIG. 27 is merely illustrative.

Figure 28:
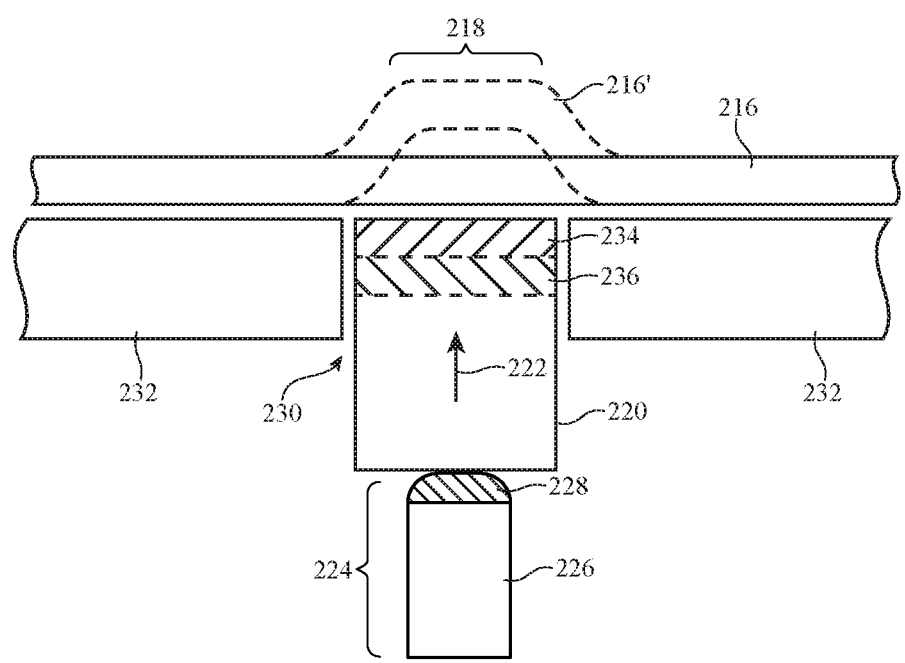
FIG. 28 is a cross-sectional side view of an illustrative illuminated input device such as a button that may be provided with haptic feedback, force and touch sensing, and an overlapping display in accordance with an embodiment.

FIG. 28 is a cross-sectional side view of structures that may be used to provide an input device such as a button with haptic capabilities, light output capabilities, and other capabilities. In the example of FIG. 28, covering layer 204 (e.g., fabric, leather, plastic, or other material) is flexible. Button member 220 may move in opening 230 in layer 232. Layer 232 may be a display layer (display), a display layer stacked with other layers (e.g., touch, force, etc.) and/or may be a support structure that does not have light output and/or input capabilities. Layer 232 may form part of a dashboard, door panel, or other structure in the interior of system 10.

Button member 220 may be controlled by device 224. Device 224 may include, for example, a solenoid, motor, and/or other actuator such as actuator 226 (sometimes referred to as a positioner, haptic device, etc.). When it is desired to raise the button of FIG. 28 above the surface of the rest of covering layer 216 (i.e., when it is desired to position button ember 220 so that the layer portion 216' on the outer end of button member 220 is proud of surrounding portions of layer 216), control circuitry 26 may direct actuator 226 to move button member 220 outwardly through opening 230 in direction 222. This may cause the outer end of button member 220 to press covering layer 216 outwardly in button region 218 (e.g., so that layer 216 is deformed to the position of layer portion 216' of FIG. 28). Actuator 226 may also be used to provide haptic feedback (e.g., by vibrating button member 220).

Force sensor 228 or other sensor structures may be incorporated into device 224. As an example, a switch, capacitive force sensor, strain gauge, or other component such as sensor 228 may be interposed between actuator 226 and button member 220. When a user presses downward on the button of FIG. 28 (e.g., on the surface of layer 216' in region 218), sensor 228 may be activated and the user press input may be detected. If desired, device 224 may be a dome switch or other switch. In this type of arrangement, a dome member, spring, or other biasing structure in the switch may be used to press covering layer 216 outwardly in button region 218.

Buttons of the type shown in FIG. 28 may be provided with light-based output devices such as illustrative device 236. Devices such as device 236 may be displays (e.g., displays with arrays of pixels) or may be single light-emitting diodes or other light sources. Touch sensors such as illustrative touch sensor 234 may be interposed between display 236 and covering layer 216 or may be omitted. Touch sensors such as touch sensor 234 may have an array of touch sensor electrodes or may have a single electrode. If desired, a capacitive touch sensor or other sensors may be integrated into layer 216. For example, layer 216 may be a fabric layer having conductive strands that form capacitive touch sensor electrodes and/or force sensor electrodes.

Buttons such as the illustrative button of FIG. 28 may be placed on interior surfaces of system 10 (e.g., on a dashboard, etc.). When it is desired to hide a given button, the button member 220 for that button may be retracted until the portion of layer 216 in region 218 lies flush with the remainder of layer 216. When it is desired to make the button more visible to a user, button member 226 may be advanced in direction 222 to raise the button away from the rest of layer 216 (i.e., to make portion 216' proud of the rest of layer 216). Buttons can be labeled using display 236. For example, displays such as display 236 can be turned on to present a text label or symbol to a user. The content presented on display 236 may be adjusted in real time, may be context sensitive, and/or may be fixed (e.g., a permanent button label may be displayed). If desired, display 236 may cover multiple buttons (e.g., layer 236 may be formed on the underside of layer 216 and may overlap multiple button members 220). The configuration of FIG. 28 is merely illustrative.

If desired, a vibrator or other actuator (e.g., one or more devices such as devices 206 of FIG. 27) may be adjusted as a user's finger is moved across the surface of a covering layer. The frequency of vibration of an actuator may, for example, be varied as a function of finger position. The coefficient of friction of the covering layer that is experienced by the user's finger may change as a function of the current vibrational frequency. By dynamically adjusting vibrational frequency, the surface of a covering layer may be made to be slippery or sticky at different locations of the user's finger. Virtual button border effects and other effects may be generated in this way.

Figure 29:
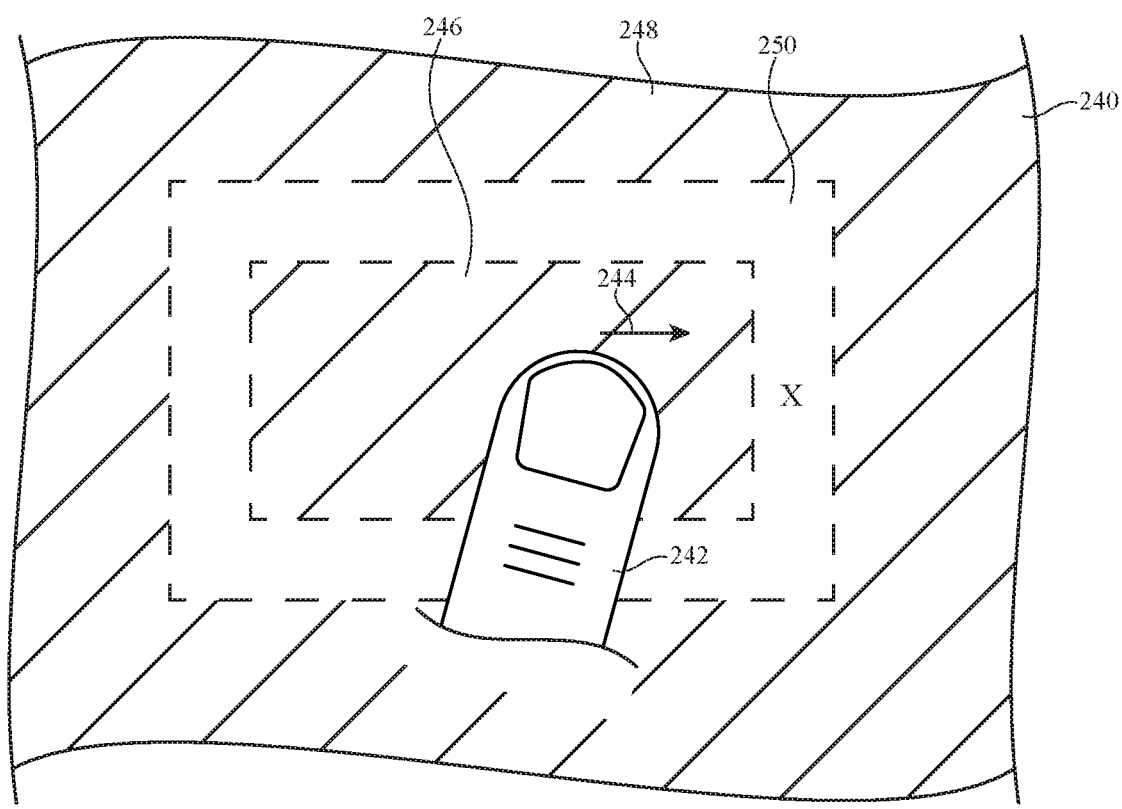
FIG. 29 is a top view of an illustrative display that has configurable smooth and sticky regions formed by vibrating the display at different frequencies as a user's finger moves across the display in accordance with an embodiment.

Consider, as an example, the arrangement shown in FIG. 29. In this example, covering layer 240 covers a capacitive touch sensor and is used to gather touch input (e.g., finger location information) from a user's finger such as finger 242. Control circuitry 36 may monitor the position of finger 242 in real time using the touch sensor. When finger 242 is in region 246 or region 248, an actuator that is coupled to covering layer 240 may be vibrated at a first frequency (e.g., 100 Hz or other suitable frequency), making covering layer 240 (and therefore area 246 or area 248) slippery. When finger 242 is detected as being present in region 250, the actuator may be vibrated at a second frequency (e.g., 1 kHz or other suitable frequency), making covering layer 240 (and therefore area 250) sticky (e.g., changing cover layer 240 so that the coefficient of friction of covering layer 240 is greater when finger 242 is in area 250 than when finger 242 is in area 246 or area 248). As a result, when finger 242 is moved across the surface of covering layer 240 in direction 244, the user will feel a sticky (higher coefficient of friction) boundary region (region 250). This boundary can be moved, resized, etc. to surround dynamically configured virtual button regions on covering layer 240. If desired, a display may display a label, symbol, or other visual output in these portions of covering layer 240. When it is desired to create a virtual button, for example, a button shape may be illuminated in a rectangular area such as area 246 and a sticky button boundary can be dynamically created by varying the vibrations produced by an actuator coupled to layer 240. A touch sensor may be used to gather touch input from finger 242 in the rectangular area. By moving the visual label, the virtual boundary, and the rectangular touch sensing region, a virtual button may be moved onto any desired portion of covering layer 240 in real time.

Figure 30:
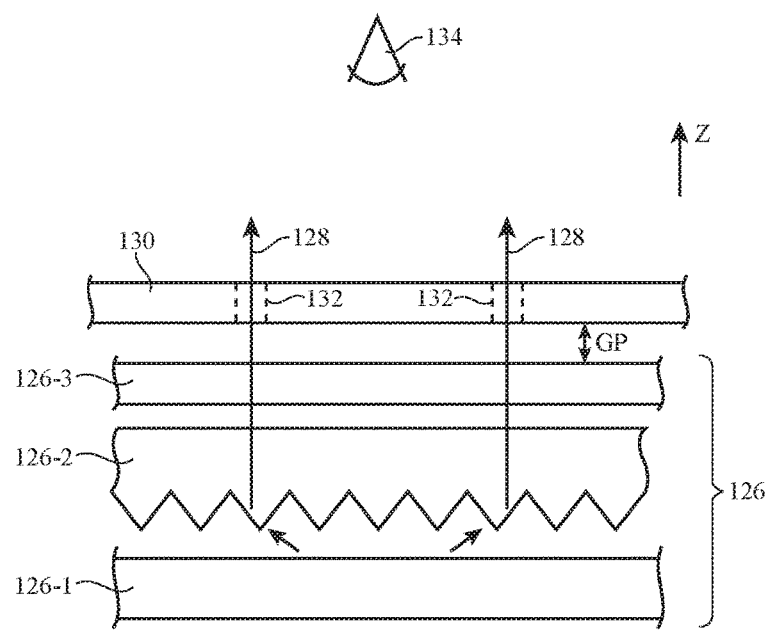
FIG. 30 is a cross-sectional side view of an illustrative display with a light collimation structure in accordance with an embodiment.

As shown in FIG. 30, display 126 may have light collimating structures that help collimate light 128 so that images displayed through openings 132 in layer 130 are not blurred. As described in connection with FIG. 13, openings 132 may be openings such as openings 75 in fabric 74, openings 82 in layer 80 of FIG. 6, or other openings in a covering layer. The density of openings 132 (e.g., the number and/or size of openings 132 in a given area) may be adjusted as a function of position in display 126 (e.g., to even out luminance and/or color variations due to the properties of layer 130, to create intentional luminance hotspots, etc.). In the example of FIG. 30, display 126 is a liquid crystal display having light modulator layer 126-3 (e.g., an array of liquid crystal display pixels suitable for displaying images, a set of one or more larger areas in a liquid crystal light modulator patterned to form one or more symbols, etc.). Backlight unit 126-1 (e.g., a transparent light guide layer that is supplied with light along its edges by a light-emitting diodes, an array of direct backlighting light-emitting diodes, etc.) may be used to produce uncollimated backlight illumination 128. A light collimating structure such as prism film 126-3 may be used to collimate uncollimated light 128 from backlight 126-1 and thereby ensure that light 128 that is passing through openings 132 is collimated and in alignment with axis Z (e.g., parallel to the longitudinal axes of openings 132). If desired, other light collimating structures may be used for display 126. The example of FIG. 30 in which display 126 has a prism film to help align collimate light 128 is merely illustrative. Undesired light spreading from the pixels of a display may also be minimized by minimizing air gap GP between light modulator layer 126-3 and covering layer 130 (e.g., by ensuring that GP is less than 5 mm, less than 0.5 mm, less than 0.05 mm, between 0.01 and 0.2 mm, more than 0.04 mm, less than 0.3 mm, or other suitable distance).

Figure 31:
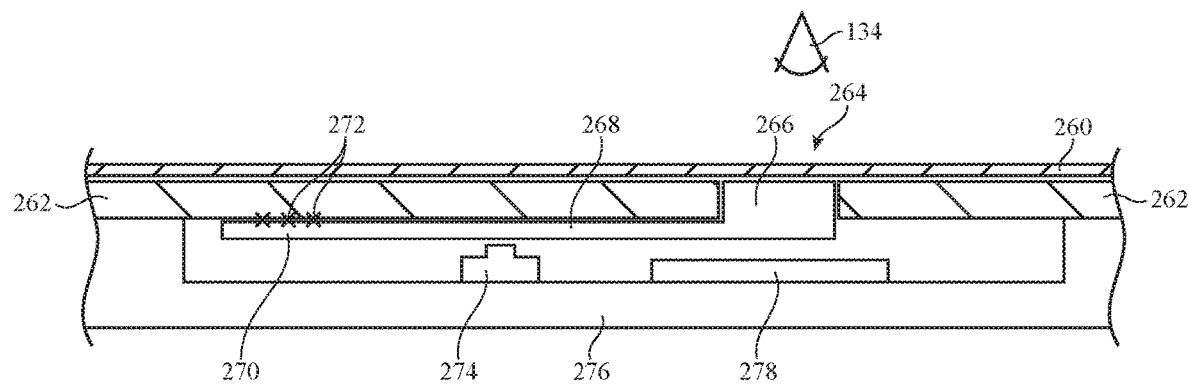
FIG. 31 is a cross-sectional side view of an illustrative button with a display in accordance with an embodiment.

An illustrative button of the type that may be covered by a covering layer and provided with a display is shown in FIG. 31. As shown in FIG. 31, button 264 may have a button member such as button member 268. Button member 268 may have portions that form an elongated flexible arm. One end of the arm (end 270) may be coupled to support structure 262 using attachment structures 272. Attachment structures 272 may be welds, screws or other fasteners, adhesive, or other mounting structures for attaching button member 268 to support structure 262. An opposing end 266 of button member 268 may move within an opening in support structure 262. When the portion of button member 268 in the opening of support structure 262 is pressed inwardly (e.g., when a user presses downwardly on the portion of covering layer 260 that overlaps end 266 of button member 268), member 268 may flex downwardly onto switch 274. The state of switch 274 may be monitored to determine when member 268 has been pressed. When member 268 has not been pressed, switch 274 will have a first state (e.g., an open state) and when member 268 has been pressed, switch 274 will have a second state (e.g., a closed state).

Switch 274 may be mounted on rear support 276. Rear support 276 may be formed from plastic, metal, or other suitable material and may serve as a supporting structure for button 264. Button member 268 may be formed from plastic, metal, or other materials. Support structure 262 may be formed from plastic, metal, etc. With one illustrative configuration, portions of button member 268 and/or the supporting layer formed from support structure 262 may be transparent (e.g., member 268 and/or structure 262 may be formed from transparent acrylic or other clear plastic). This allows images and other light from display 278 (or other light-emitting device) to be conveyed outwardly to viewer 134. Covering layer 260 may be formed from a flexible material that allows button member portion 266 to be pressed inwardly by pressing against the outer surface of cover layer 260. For example, covering layer 260 may be formed from fabric, leather, flexible plastic, flexible wood, etc. Layer 260 may be transparent and/or may have openings to allow light from display 278 to pass through layer 260. Button switch 274 may be placed to the side of display 278, so that display 278 is not blocked by switch 274. The cantilever configuration of button member 268 allows switch force and therefore the feeling of button 264 to a user to be adjusted as desired. Display 278 may have a footprint (outline when viewed from above) that matches that of button end 266, may be smaller than button end 266, or may be larger than button end 266.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
    a covering layer, wherein the covering layer comprises:
        a first set of openings that are oriented at a first angle relative to a surface normal of the covering layer, and
        a second set of openings that are oriented at a second angle relative to the surface normal;
    a background layer;
    an electronic shutter between the background layer and the covering layer; and
    a display layer having an array of pixels between the covering layer and the background layer that is configured to display an image through the covering layer.

2. The apparatus defined in claim 1 wherein the display layer comprises a transparent display layer, the apparatus further comprising an additional transparent display layer that is located under a different portion of the covering layer than the transparent display layer and that displays an additional image visible through the covering layer, wherein the transparent display is operable in an off state while the additional transparent display layer is displaying the additional image through the covering layer.

3. The apparatus defined in claim 1 wherein the display layer comprises a transparent display layer and wherein the electronic shutter is operable in an opaque mode when the transparent display layer is displaying the image and is operable in a transparent mode when the transparent display layer is off.

4. The apparatus defined in claim 1 wherein the electronic shutter is operable in a translucent mode when the display layer is displaying the image and is operable in a transparent mode when the display layer is off.

5. The apparatus defined in claim 1 further comprising:
    a vehicle body having an interior;
    a door coupled to the vehicle body;
    a seat in the interior; and
    a dashboard in the interior, wherein the covering layer covers at least a region of the dashboard and wherein the image is displayed in the region.

6. The apparatus defined in claim 1 wherein the covering layer comprises wood.

7. The apparatus defined in claim 1, wherein the array of pixels comprises even rows and odd rows of pixels, wherein the even rows are aligned with the first set of openings, and wherein the odd rows are aligned with the second set of openings.

8. The apparatus defined in claim 1, herein the array of pixels comprises even columns and odd columns of pixels, wherein the even columns are aligned with the first set of openings, and wherein the odd columns are aligned with the second set of openings.

9. The apparatus defined in claim 1, further comprising:
    a vehicle body having an interior;
    a door coupled to the vehicle body;
    first and second seats in the interior; and
    a dashboard in the interior, wherein the covering layer covers at least a region of the dashboard, wherein the image is displayed in the region, wherein the first set of openings are oriented towards the first seat, and wherein the second set of openings are oriented towards the second seat.

10. The apparatus defined in claim 1, wherein the display layer is configured to display the image through at least some of the first and second sets of openings in the cover layer.

11. The apparatus defined in claim 10, wherein the openings in the first and second sets have a diameter that is less than 500 microns.

12. The apparatus defined in claim 1, further comprising:
a force sensor configured to measure a force input applied to the covering layer; and
control circuitry configured to adjust the image based on the force input.

13. The apparatus defined in claim 1, further comprising:
a haptic device coupled to the covering layer, wherein the haptic device is configured to vibrate the covering layer in response to a touch input at the covering layer.

* * * * *